(12) United States Patent
Fujisawa

(10) Patent No.: US 7,184,323 B2
(45) Date of Patent: Feb. 27, 2007

(54) 4N PRE-FETCH MEMORY DATA TRANSFER SYSTEM

(75) Inventor: Hiroki Fujisawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 30 days.

(21) Appl. No.: 10/990,990

(22) Filed: Nov. 18, 2004

(65) Prior Publication Data

US 2005/0117403 A1 Jun. 2, 2005

(30) Foreign Application Priority Data

Nov. 27, 2003 (JP) ............................. 2003-396649

(51) Int. Cl.
*G11C 7/10* (2006.01)

(52) U.S. Cl. ................ 365/189.05; 365/219; 365/233; 365/194; 365/207

(58) Field of Classification Search ........... 365/189.05, 365/219, 233, 233.5, 93
See application file for complete search history.

(56) References Cited

U.S. PATENT DOCUMENTS

| | | | | |
|---|---|---|---|---|
| 4,800,530 | A * | 1/1989 | Itoh et al. ............... | 365/189.12 |
| 5,825,709 | A * | 10/1998 | Kobayashi ............. | 365/230.03 |
| 6,081,479 | A * | 6/2000 | Ji et al. ..................... | 365/233 |
| 6,085,300 | A * | 7/2000 | Sunaga et al. ............... | 711/168 |
| 6,512,719 | B2 * | 1/2003 | Fujisawa et al. ............ | 365/233 |
| 6,914,828 | B2 * | 7/2005 | Kono ..................... | 365/189.01 |

FOREIGN PATENT DOCUMENTS

JP  2002-25265  1/2002

* cited by examiner

*Primary Examiner*—Amir Zarabian
*Assistant Examiner*—Michael Weinberg
(74) *Attorney, Agent, or Firm*—McGinn IP Law Group, PLLC

(57) ABSTRACT

A semiconductor storage device has a data transfer circuit capable of reducing the latency, including a control circuit for frequency-dividing external clock signal to generate readout clocks, first to fourth amplifier circuits for amplifying read data corresponding to first and fourth addresses, based on readout clock signals, a first multiplexer receiving and selectively outputting temporally preceding and temporally succeeding first and second output data from two amplifier circuits associated with two even addresses, a second multiplexer receiving and selectively outputting temporally preceding and temporally succeeding third and fourth output data from two amplifier circuits associated with two odd addresses, first and second latch circuits for latching and outputting second and fourth output data, a third multiplexer receiving first and third data and outputting the latched data in the read address sequence, a fourth multiplexer receiving second and fourth data and outputting the latched data in the read address sequence, first and second registers receiving outputs of the third and fourth multiplexers, and a fifth multiplexer sending out two outputs each of the first and second registers, totaling at four outputs, in synchronism with rising and falling edges of the clock signal.

11 Claims, 12 Drawing Sheets

4N PRE-FETCH MEMORY DATA TRANSFER SYSTEM

FIELD OF THE INVENTION

This invention relates to a semiconductor integrated circuit device and, more particularly, to a data transfer circuit having a pre-fetch memory for simultaneously reading out plural bits from memory cells and for serially outputting the so read-out bits.

BACKGROUND OF THE INVENTION

The pre-fetch memory data transfer system of this sort is generally meritorious in improving the operating frequency in a clock synchronized semiconductor storage device. In actuality, in a DDR (Double Data Rate)-1 SDRAM (Synchronous Dynamic Random Access Memory), and in a DDR-2 SDRAM, the data transfer rate is improved by increasing the number of pre-fetch to 2N and to 4N (N=1; number of I/Os per address), respectively. However, the access time speedup of the chip itself cannot be achieved with ease.

Hence, only the data transmitting rate is improved, without improving the access time, by increasing the latency with increase in the operating frequency.

In actuality, while the data transfer rate of the DDR-1 SDRAM is 266 Mbps (megabits/second), the data transfer rate twice this rate, that is, 533 Mbps, may be achieved with the DDR-2 SDRAM, using the device of the similar performance.

However, with the DDR-1 SDRAM, the latency is two clocks, which is 15 ns in terms of the access time, while it is 4 clocks with the DDR-2 SDRAM, with the access time being 15 ns which is equal to that of the DDR-1 SDRAM.

With the DDR-2 SDRAM, the data path circuit is complicated by increasing the latency from 2 clocks to 4 clocks. In addition, the problem of delayed access time is presented as a result of increase in the number of stages of the output register FIFO (first-in first-out).

Moreover, there has recently been raised a demand not only for improving the data transfer rate but also for improving access time (latency).

As for a data transmitting circuit for performing 2N pre-fetch operation in the SDRAM readout circuit, reference is had to e.g. the following Patent Publication 1. This Patent Publication 1 discloses the configuration in which, for decreasing the peak current at the time when 32-bit data read out to a main input/output line (MIO line) are sensed by a main amplifier circuit and transmitted in parallel through the global input/output line (GIO line) to an output register, first output data are output with a timing shift relative to second output data.

[Patent Document 1]

JP Patent Kokai Publication No.JP-P2002-25265A (pages 7 and 9 and FIGS. 4 and 9)

FIG. 11 shows a typical example of a 2N pre-fetch data transfer circuit at the time of reading a conventional DDR-1 SDRAM. FIG. 12 is a timing diagram showing an example of the readout operation of the configuration shown in FIG. 11. As may be apparent from comparison with FIG. 1 (configuration of the embodiment of the present invention), as later explained, the configuration of FIG. 11 is such that data for one clock cycle is not held on the GIO line. With the design specifications of the SDRAM, a read command (READ) can be entered for the rise of each of the external clock signal CK, as shown in FIG. 12. If data is held on the GIO line for one clock period, a given read data collides against the next read data on the GIO line to give rise to malfunctions. Hence, data transfer occurs using a signal generated with one-shot pulses (MAB0 and MOE0) as from the clock cycle during which the read command has been entered (such as CK [0] of FIG. 12), such that it is necessary to transfer the data during one clock cycle period until the next clock cycle (such as CK[1] of FIG.12).

Referring to FIGS. 11 and 12, an MA control circuit 110A, supplied with a read clock RCLK0, generated from the external clock signal CK, to output the main amplifier output control signals MAE0 and MOE0, generates one-shot pulses (output control signals MAE0 and MOE0), based on the rising edge of the read clock RCKL0 and on the rising edge of a signal corresponding to a delayed version of the read clock RCKL0. In FIG. 11, the selection circuit 102 interchanges the connection across two inputs and two outputs so that, out of read data of even addresses and odd addresses, the data to be output first and data to be output later will be output to the F-GIO line and to the S-GIO line, respectively, in accordance with the start address. The latch circuit 103 delays data to be output later, in accordance with the start address, out of the read data of even and odd addresses, to output the so delayed data to the S-GIO line. The selection circuit 108A selects two outputs of the output register (FIFO, based on the rising edges and the falling edges of the clock signal CK20) (having the same frequency as that of the external clock signal) to output the selected outputs as serial data. An output of the last stage of the four-stage latch circuit 106, issued by the rise of the clock signal CK, is selected by the rise of the clock signal CK20, while the output of the last stage of the four-stage latch circuit 107, issued by the rise of the clock signal CK20, is selected by the fall of the clock signal CK20. An output buffer 109 receives an output from the selection circuit 108A to send the output to an external data terminal DQ.

SUMMARY OF THE DISCLOSURE

In the conventional data transfer circuit, shown in FIG. 11, data transfer is carried out using a signal with a one-shot pulse generated from the clock signal with which the read command has been entered, such that data transfer needs to be completed during the period until the next clock. Hence, data cannot be held on the GIO line during plural clock cycles.

For this reason, a pipeline stage '0' (Stage_0) in the pre-fetch data transfer is up to the first stage of the output register circuit (FIFO), such that four stages are necessary for the latch circuits (106, 107) of the output register. The result is that it is difficult to speed up the access time, with the latency increasing with improvement in the operating frequency.

There is further a problem that, with increasing complexity of the output register circuit, the chip area as well as current consumption is increased.

Accordingly it is an object of the present invention to provide a semiconductor integrated circuit device in which, by simplifying the structure of the data transfer circuit of the pre-fetch memory configuration, it is possible to reduce the latency.

It is another object of the present invention to provide a semiconductor integrated circuit device in which, by reducing the number of stages of the latch circuit of the output register, it is possible to simplify the control of the output circuit to achieve saving in the chip area to reduce the current consumption.

The above and other objects are attained by the present invention having a circuit for holding data for plural clock cycles on a data transfer circuit between a data pad and a memory cell in a pre-fetch memory for simultaneously reading/writing plural data.

A semiconductor integrated circuit device in accordance with one aspect of the present invention includes a first signal transmitting path for transmitting a plurality of data signals in parallel, a plurality of amplifier circuit units each receiving one of the plural data signals, a second signal transmitting path for transmitting the plural data signals, amplified by the plural amplifier circuit units, a plurality of registers each receiving one of the plural data signals transmitted over the second signal transmitting path, and an output unit for serially outputting the plural data signals, respectively held by said plural registers, responsive to a clock signal for synchronization. The plural amplifier circuit units delays the outputting timing of at least one data signal to be output later than another data signal to be output first, out of the plural data signals. The data signals are held during at least one clock cycle on the second signal transmitting path.

A semiconductor integrated circuit device in accordance with another aspect of the present invention includes a control circuit for generating first and second control signals, different in the timing phase of activation, based on a signal obtained on frequency dividing a clock signal supplied to the semiconductor integrated circuit device from outside the semiconductor integrated circuit device, and an amplifier circuit stage including four amplifier circuits, first and second selection circuits, and first and second latch circuits, with the four amplifier circuits receiving read data signals from a memory cell array corresponding to four addresses, supplied with the first control signal in common, and amplifying/outputting data signals corresponding to the four addresses, responsive to the first control signal. The first selection circuit, receiving data signals of two even addresses of the four addresses, changes over a signal transmitting path of the output destination, responsive to a read start address, depending on which of the data signals of two even addresses is output first and on which of the data signals is output later. The first latch circuit, receiving the one of the data signals of two even addresses, output later, sends out a latch output to a corresponding signal transmitting path responsive to the second control signal. The second selection circuit, receiving data signals of two odd addresses of the four addresses, changes over a signal transmitting path of the output destination, responsive to a read start address, depending on which of the data signals of two odd addresses is output first and on which of the data signals is output later. The second latch circuit, receiving the one of the data signals of two odd addresses output later, sends out a latch output to a corresponding signal transmitting path responsive to the second control signal. A third selection circuit, supplied with the data signal of the even address, output first, and transmitted from the amplifier circuit stage to the signal transmitting path, and with the data signal of the odd address, output first, and transmitted from the amplifier circuit stage to the signal transmitting path, sends the data signals to two outputs of the first output register in accordance with the readout sequence. A fourth selection circuit, supplied with the data signal of the even address, output later, and transmitted from the amplifier circuit stage to the signal transmitting path, and with the data signal of the odd address, output first, and transmitted from the amplifier circuit stage to the signal transmitting path, sends the data signals to two outputs of the second output register in accordance with the readout sequence. A fifth selection circuit supplied with two outputs of the first output register and with two outputs of the second output register, totaling at four outputs, sends out the four outputs as serial data output signals in the read address sequence responsive to rising and falling edges of an input synchronizing clock signal.

The meritorious effects of the present invention are summarized as follows.

According to the present invention, it is possible to hold data on a signal transmitting path for data transfer during a period corresponding to plural clock cycles, as a result of which it is possible to reduce the number of stages of the latch circuit for latency to speed up the data transfer time.

According to the present invention, it is possible to simplify the control of the output circuit, by reducing the number of stages of the latch circuit of the output register, as well as to save the chip area and to reduce current consumption, that is, power dissipation.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
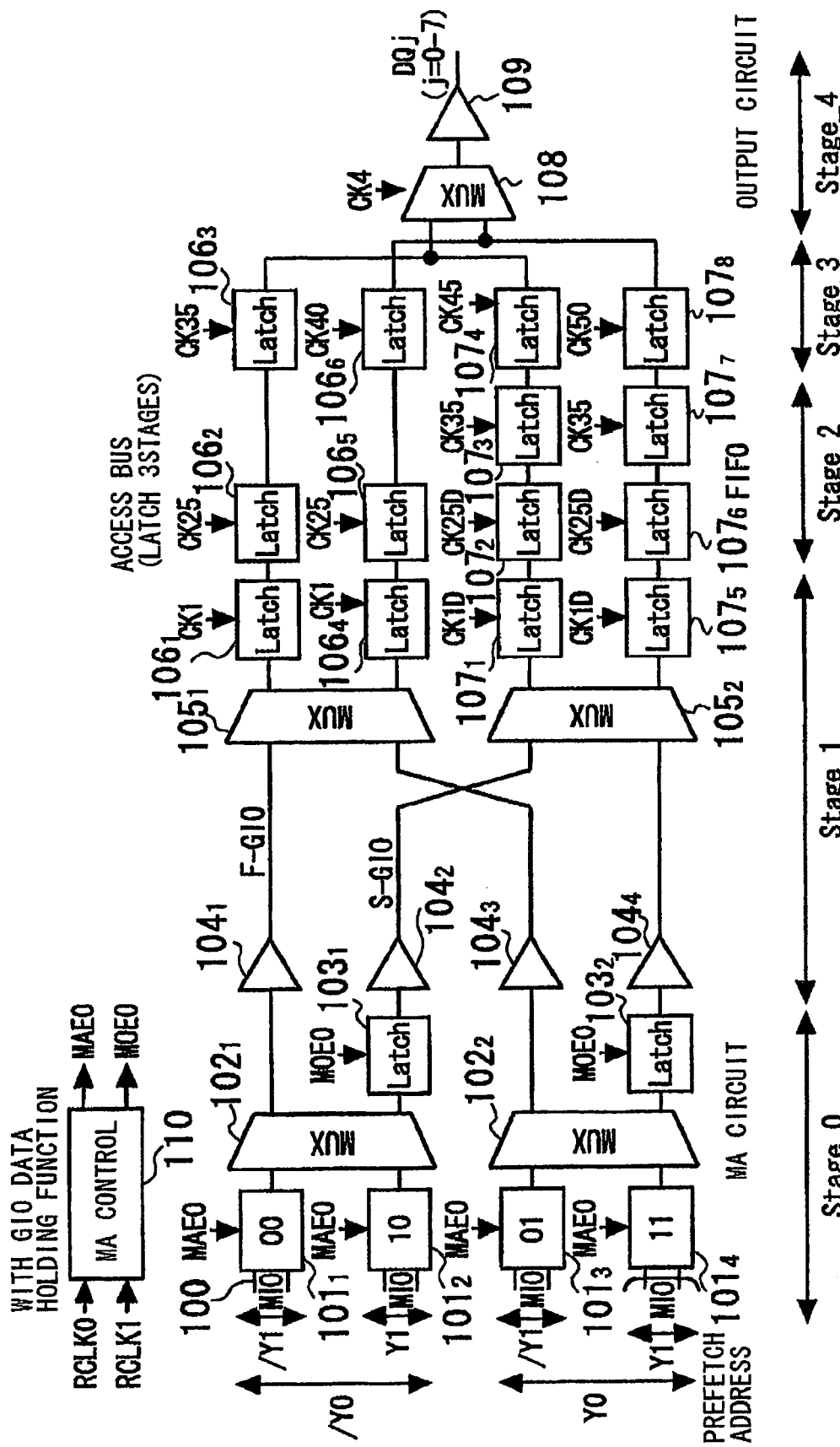
FIG. 1 shows a configuration of a data transfer circuit according to an embodiment of the present invention.

Referring to the drawings, the architecture and preferred embodiments of the present invention are explained, in this order, for detailed explanation of the present invention.

FIG. 1 shows a pre-fetch system data transfer circuit according to the present invention. The data transfer circuit according to the present embodiment includes an amplifier control circuit 110 supplied with first and second read control signals (RCLK0 and RCLK1) of respective different phases, obtained on frequency dividing by 2 of a clock signal supplied to a semiconductor storage device to generate first and second control signals (MAE0 and MOE0) of respective different phases, and first to fourth amplifiers (main amplifiers $101_1$ to $101_4$), supplied on lines 100 with read data from the memory cell array corresponding to four addresses from a main input/output line (MIO) and with the common control signal (MAE0) in common to amplify and output read data corresponding to the four addresses responsive to the first control signal (MAE0).

The data transfer circuit according to the present embodiment also includes first to fourth amplifier output circuits ($104_1$ to $104_4$), a first selection circuit $102_1$, supplied with first and second output data from two amplifier circuits, associated with two even addresses, out of the four addresses, to switch the output destination to one of two outputs, responsive to a read start address, and a second selection circuit $102_2$, supplied with third and fourth output data from two amplifier circuits, associated with two odd addresses, out of the four addresses, to switch the output destination to one of two outputs, responsive to the read start address.

A first output end of the first selection circuit $102_1$, and a first output end of the second selection circuit $102_2$, are connected to input ends of the first and third amplifier output circuits $104_1$ and $104_3$ respectively.

There are provided a first latch circuit $103_1$ for receiving output data from a second output of the first selection circuit $102_1$ and responsive to the second control signal MOE0 to send the latch output to an input end of the second amplifier output circuit $104_2$, and a second latch circuit $103_2$ for receiving output data from a second output of the second selection circuit $102_2$ and responsive to the second control signal MOB0 to send the latch output to an input end of the fourth amplifier output circuit $104_4$.

There are also provided a third selection circuit $105_1$ supplied with output data transmitted on first and third signal transmission paths, from the first and third amplifier output circuits $104_1$ and $104_3$ to switch the output destination to the first and second output ends, in the readout sequence, a fourth selection circuit $105_2$ supplied with output data transmitted on second and fourth signal transmission paths, from the second and fourth amplifier output circuits $104_2$ and $104_4$ to switch the output destination to the first and second output ends, in the readout sequence, two series of FIFO type first output registers $106_1$ to $106_3$ and $106_4$ to $106_6$, supplied with output data of first and second output ends of the third selection circuit $105_1$ in parallel, two series of FIFO type second output registers $107_1$ to $107_4$ and $107_5$ to $107_8$, supplied with output data of first and second output ends of the fourth selection circuit $105_2$ in parallel, a fifth selection circuit 108, supplied with the two series outputs of the first output registers and with the two series outputs of the second output registers, totaling at four series outputs, to output the input output data as serial data signals, corresponding to the readout addresses, in timed relation to the rise an falling edges of the input clock signal, and an output buffer 109, receiving an output of the fifth selection circuit 108 to driving-output data to a data pad (terminal DQ).

In contradistinction from the configuration of transferring 32-bit data from the main amplifier circuits $101_1$ to $101_4$ to the FIFO (first-in first-out) using an F-GIO (global input/output) line and an S-GIO line, two control signals, namely the control signal MAE0 for controlling the data outputting circuit to the F-GIO line and the control signal MOE0 for controlling the data outputting circuit to the S-GIO line, are provided, according to the present invention, as shown in FIG. 1.

The main amplifier control circuit 110 is supplied with two read clock signals (RCKL0 and RCLK1), having respective different phases, to output first and second output control signals (MAE0 and MOE0). The rise of the first output control signal MAE0 is generated from the rise of the first read clock signal RCKL0, while the fall of the first output control signal MAE0 is generated from the rise of the second read clock signal RCLK1. Since the two read clock signals (RCKL0 and RCLK1) are generated from different edges of the external clock signal (CK), the period of the first output control signal MAE0 is a length corresponding to several clock cycle periods. On the other hand, the second output control signal MOE0 has its rising edge generated similarly from the rise of the first read clock signal RCKL0, however, it is controlled at a timing different from that of the first output control signal MAE0 (delayed). The second output control signal MOE0 has its falling edge generated from the rise of the second read clock signal RCLK1, with the period of the second output control signal MOE0 being a length corresponding to several clock cycle periods.

With the above-described structure of the embodiment of the present invention, data may be maintained for plural clock cycle periods on the data bus, and hence the number of stages of the latch circuit of the FIFO part for latency may be diminished to speed up the data transfer time.

Embodiments of the Invention

Referring to the drawings, preferred embodiments of the present invention are hereinafter explained for further detailed explanation of the present invention.

Figure 2:
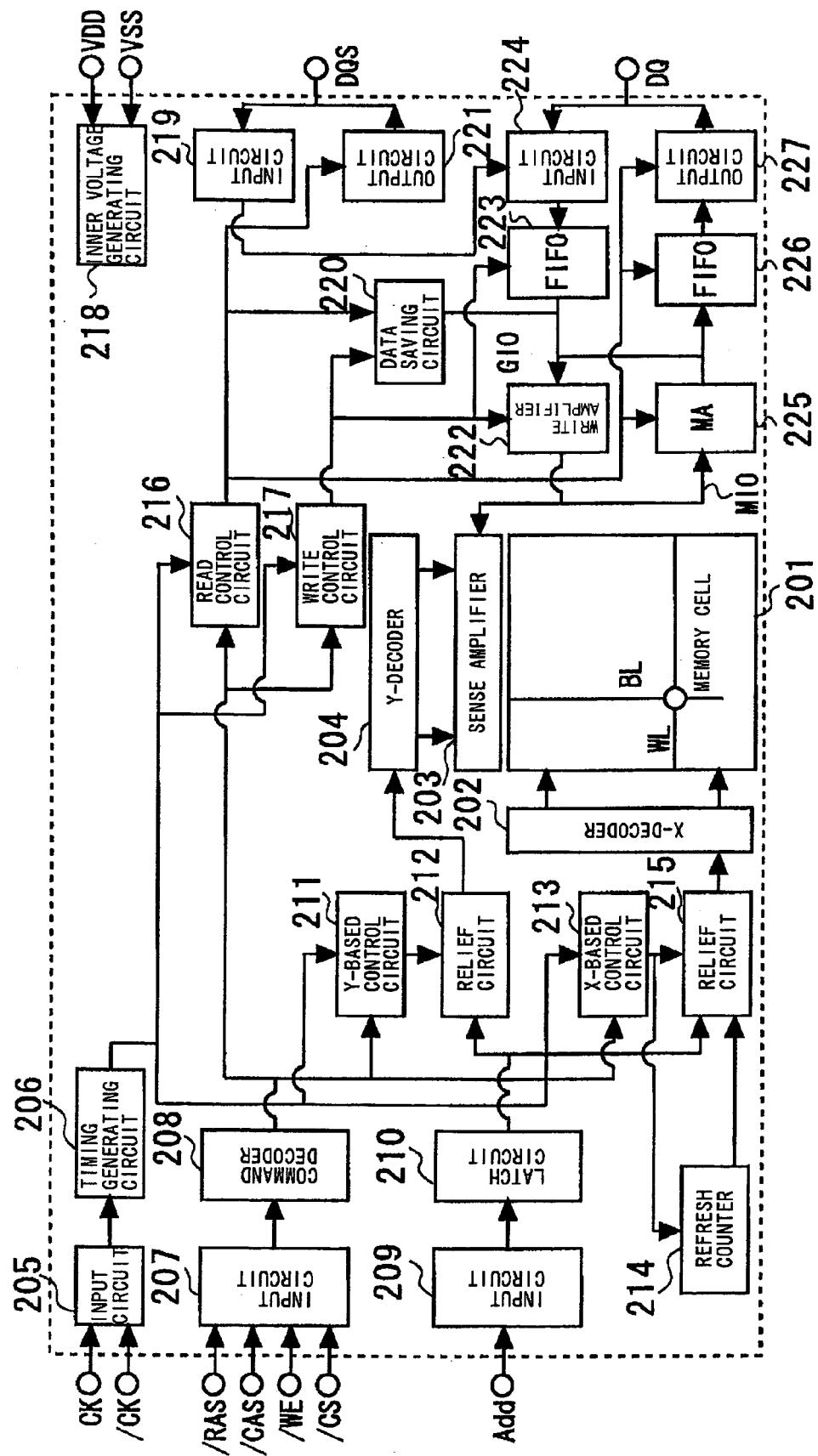
FIG. 2 shows a configuration of a memory device according to the embodiment of the present invention.

FIG. 2 depicts an overall block diagram of an embodiment of a DDR SDRAM (double data rate synchronous DRAM) according to the present invention. Referring to FIG. 2, control input signals are a row address strobe signal /RAS, a column address strobe signal /CAS, a write enable signal /WE and a chip select signal /CS, where/corresponds to an over-bar of a logical symbol which states that the low level denotes an active level. X-address signal and Y-address signal are chronologically entered from a common address terminal Add in synchronism with complementary clock signals CK and CK/. The control signals /RAS, /CAS, /WE and /CS are entered at an input circuit 207 and thence supplied to a command decoder 208. The command decoder 208 decodes e.g. read/write commands, based on input signals, to control a read control circuit 216 and a write control circuit 217 as well as to output control signals to an X-based control circuit 213 and a Y-based control circuit 211.

An X-address signal and a Y-address signal, entered via an address buffer 209, are taken into a latch circuit 210. The X-address signal, taken into the latch circuit 210, is supplied to a pre-decoder (X-relief circuit) 213, an output signal of which is supplied to an X-decoder 202 to form a selection signal for a word line WL. By the selecting operation of the word line, a minute readout signal appears on a complementary type bit line BL of the memory array 201 and is amplified by a sense amplifier 203. The Y-address signal, taken into the latch circuit 210, is supplied to the pre-decoder (Y-relief circuit) 212, an output signal of which is supplied to a Y-decoder 204 to form a selection signal for the bit line BL. X-relief circuit 215 and Y-relief circuit 212 have the fail address information and compare a stored fail address with the taken-in address signal. In case of coincidence of the compared results, the X-relief circuit 215 and the Y-relief circuit 212 command the X-decoder 202 and the Y-decoder 204 to select a redundant word line or a redundant bit line, while inhibiting the operation of selecting regular word or bit lines.

The stored data information, amplified by a sense amplifier 203, and selected by a column switch circuit, not shown, is coupled to a common input/output line MIO so as to be transmitted to a main amplifier 225. Although there is no limitation to the main amplifier 225, there is also provided a write circuit write amplifier 222. That is, for the readout operation, a readout signal, read out through a Y switch circuit, is amplified and output through an output buffer circuit (output circuit) 227 from the external terminal DQ. For the write operation, the write signal, entered from the external terminal DQ, is taken via an input buffer (input circuit) 224 and thence supplied via a write circuit to a common input/output line and a selected bit line. In the selected bit line, the write signal is transmitted by the amplifying operation of the sense amplifier 203 and corresponding electrical charges are held in a capacitor of the memory cell.

A timing generating circuit 206 generates a variety of timing signals needed for the memory cell selecting operation, such as intake control timing signals for the address signal, entered in association with complementary clock signals CK and /CK and signals /RAS and /CAS, or timing signals for the sense amplifier operation, such as various timing signals needed for selecting the memory cells.

An internal power supply generating circuit 218 receives operating voltages, that is, a high potential side power supply voltage VCC and a low potential side power supply voltage VSS, supplied from power supply terminals, to generate a variety of internal voltages, such as the plate voltage, precharge voltage, such as VCC/2, internal boost voltage VPP, internal drop voltage VDL or substrate back-bias voltage VBB.

A refresh counter 214 generates, when in a refresh mode, a refresh address signal, which is used for X-related selection operations.

A transfer circuit of the read system, composed of the MIO, main amplifier 225, GIO line, FIFO 226 and the output circuit (output buffer) 227, corresponds to the data transfer circuit shown in FIG. 1. The read-based control circuit 216, generating a signal for controlling the main amplifier 225, has a function corresponding to that of the main amplifier control circuit 110. Moreover, the input circuit (input buffer) 224, FIFO 223, GIO line, write amplifier 222 and the MIO line make up a write-related data transfer circuit. DQS is an I/O terminal for a data strobe signal.

Figure 3:
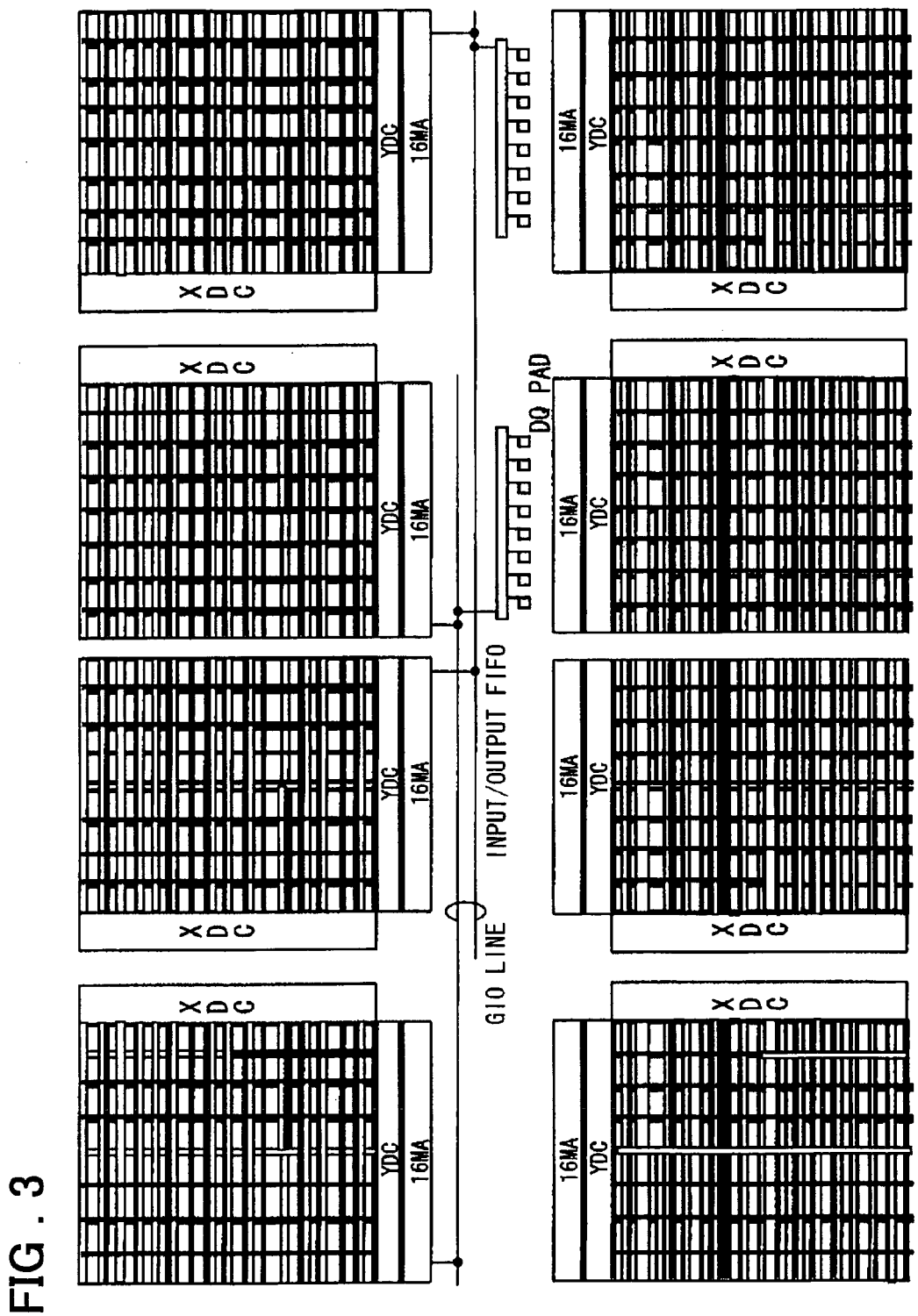
FIG. 3 shows a layout configuration of an entire chip according to the embodiment of a DDR SDRAM of the present invention.

FIG. 3 shows a layout structure of an entire chip of the embodiment of the DDR SDRAM according to the present invention. Referring to FIG. 3, an SDRAM of the present embodiment is in the form of a chip split into eight sections to form plural memory blocks or banks. The respective blocks of the chip are of similar structures. An X-decoder XDC is arranged for extending along one end of the memory array. Towards the mid part of the chip, there are a Y decoder YDC and a main amplifier MA for extending at right angles to the X-decoder. The eight memory blocks are arranged with vertical symmetry on the drawing sheet, with two blocks as a set, to form a sole memory bank, with the X-decoders lying adjacent to each other. Two of such memory banks, each composed of the two sets of an upper memory block and a lower memory block, are arranged with vertical symmetry on the drawing sheet. The memory blocks are arranged with vertical symmetry, with the Y decoders YDC and the main amplifiers MA, lying adjacent to each other, with a peripheral circuit, mounted extending horizontally between the chips, as the center.

The memory array of a given memory block is split into plural arrays along the Y selection line extending from the Y decoder YDC. A sub-word line provided in each array is selected by a main word line arranged for traversing plural arrays and by a sub-word line selection line, in a hierarchical word line configuration. This diminishes the number of memory cells connected to the sub-word lines to speed up the sub-word line selecting operations.

The memory block includes a plural number of arrays along a Y-selection line extending from the Y decoder YDC. Each bit line is divided from one array to another. This reduces the number of memory cells connected to the bit line and assures the signal voltage read out from the memory cell to the bit line. Each memory cell is made up by a dynamic memory cell and the presence or absence of charges in a storage capacitor is made to correspond to the information of 1 or 0. Since the readout operation is carried out by charge coupling of charges of the storage capacitor and the pre-charges on the bit line, the needed signal volume may be obtained by decreasing the number of memory cells connected to the bit line.

On the left and right sides of the arrays, obtained on splitting, there are formed sub-word driver strings and, on the upper and lower sides of the arrays (along the bit line direction), there are formed sense amplifier strings. In the sense amplifier string, there are provided e.g. a column selection circuit and a bit line pre-charge circuit, such that a minor potential difference appearing across the respective bit lines as a result of data readout from the memory cell by the selection of the word line (sub-word line) is detected and amplified by the sense amplifier.

A main input/output line MIO is extended vertically in the drawing on the sub-word driver string, although this configuration is merely illustrative. A local input/output line LIO is arranged along the sense amplifier string. The local input/output line LIO and the main input/output line MIO are interconnected by a row-related selection signal. The peripheral circuit is provided with the aforementioned global input/output line GIO which is connected to the main input/output line MIO associated with the selected memory bank. The global input/output line MIO is connected to a pad DQPAD connected to an external output terminal through the input/output FIFO via the aforementioned output buffer and the input buffer.

Although not shown, a peripheral circuit, as now explained, is provided at a mid part of the chip. An address signal, supplied from an address input terminal, is taken into a row address buffer circuit and a column address buffer in an address multiplex configuration. The address signal supplied is held in each address buffer. For example, a row address buffer and a column address buffer each hold an address signal taken during a memory cycle. In a mid part of the chip, there is also provided a relief circuit, formed by e.g. a fuse and a MOSFET responsible for address comparison.

In a refresh operating mode, the row address buffer takes the refresh address signal, output from the refresh control circuit, as a row address signal. In the present embodiment, the refresh address signal is taken as a row address signal via a clock generator, only by way of an example. The address signal, taken into the column address buffer, is supplied as preset data to a column address counter provided as a part of the control circuit. The column address counter outputs a column address signal, as preset data, or a value obtained on sequentially incrementing the column address signal, to the Y decoder YDC, depending on an operating mode as specified by e.g. a command signal, which will be explained subsequently.

The control circuit is supplied with external control signals, such as clock signal, clock enable signals, chip select signals, column address strobe signals, row address strobe signals, write enable signals, or data input/output mask control signal, and with an address signal, associated with a memory bank, only by way of an example, and forms various control signals, such as DDR SDRAM operating modes, and various associated timing signals. To this end, the control circuit includes a control logic and a mode register.

In the DDR SDRAM of the present embodiment, the main input/output line MIO is divided, responsive to the Y0 and Y1 addresses, to 0 address (Y0=0, Y1=0);
1 address (Y0=1, Y1=0);
2 address (Y0=0, Y1=1);
3 address (Y0=1, Y1=1)

(see the correspondence between the main input/output line MIO and the main amplifier shown in FIG. 1). For the read operation, 8 bits each from the respective memory cell arrays, totaling at 32 bits, are selected and, using the global input/output line GIO, 32 bit data are output, by way of performing a 4N pre-fetch operation, where N (number of I/Os per address)=8.

The output circuit outputs 8 bits of the 'address 0' in synchronism with the rise of the first clock signal CK, and outputs 8 bits of the 'address 1' in synchronism with the fall of the first clock signal CK, while outputting 8 bits of the 'address 2' in synchronism with the rise of the next second clock signal CK, and outputting remaining 8 bits of the 'address 3' in synchronism with the fall of the second clock signal CK.

The present invention is directed, in a non-limited fashion, to a DDR SDRAM having a large storage capacity, such as approximately 256 Mbits. Each chip is divided into eight memory blocks, with two of the blocks making up a bank. Each memory block is divided into 8×16 arrays (sub-mats), each sub-mat being 512×512 bits. That is, 512 memory cells are connected to a sub-word line, and 512 memory cells are connected to a bit line. In the following explanation, the main input/output line MIO is abbreviated to a 'MIO line', using the circuit symbol MIO, while the global input/output line is abbreviated to a 'GIO line', using the circuit symbol GIO.

In the present embodiment, the main amplifier circuit, main amplifier output circuit, GIO line and the output register circuit are allocated for 0/1/2/3 addresses, respectively, and data transfer from the main amplifier to the output register is carried out simultaneously for the 0/1/2/3 addresses, as mentioned above. That is, the 32-bit data, read out to the MIO line, are sensed simultaneously by the main amplifier circuit, and transferred in parallel to the output register. Responsive to Y0, Y1 of the start address, data in the output register are output in synchronism with the rise and fall of the clock signal. Hence, in the present embodiment, 32 bits are in operation simultaneously in the main amplifier circuit and on the GIO line.

FIG. 1 shows the configuration of an embodiment of a DDR SDRAM read circuit according to the present invention. Referring to FIG. 1, the present embodiment is directed to the 4N pre-fetch operation, described above. That is, data transferred on the GIO line are output with a timing shift for the former half 16 (2N) bit output data (F-GIO) and for the latter half 16 (2N) bit output data (S-GIO), for reducing the peak current that may be generated at the time when the 32-bit data read out on the MIO line from the memory cell array are sensed simultaneously by the main amplifier circuits (MA circuits) ($104_1$ to $104_4$) and thence transferred in parallel to the output register over the GIO line.

Moreover, in the present embodiment, data are held for plural clock periods on the F-GIO line and on the S-GIO line for reducing the number of circuit stages of the access path (number of stages of the latch circuits of the output register). This is one of the features of the present invention. As for the structure, each eight of the main amplifiers, amplifier output circuits, GIO lines and output registers, are provided in association with input/output terminals DQ0 to DQ7 for each of address 0 data, address 1 data, address 2 data and address 3 data. The amplifier output circuit is provided with a MA (main amplifier) control circuit 110 for generating output control signals MAE0 and MOE0 for adjusting the output timing thereof.

In association with the start address information, 16 (2N) bit data to be output first is directly transmitted to the output register (FIFO) over the F-GIO line, while 16 (2N) bit data to be output later are latched by latch circuits $103_1$ and $103_2$ by the output control signal MOE0 from the MA control circuit 110 and delayed so as to be then transmitted to the output register FIFO over the S-GIO line.

The first and second read clock signals RCKL0 and RCLK1, forming fundamental clocks, supplied to the MA control circuit 110, are generated from the rise edges of the successive clock pulses of the external clock signal. The read clock signals RCKL0 and RCLK1 are each of a period equal to twice the clock cycle of the external clock signal CK.

In the MA control circuit 110, the rise of the output control signal MAE0 on the F-GIO line is generated from the first read clock signal RCKL0, while the fall thereof is generated from RCLK1. That is, the data outputting period on the F-GIO line are the read clock signals RCKL0 and RCLK1. It is therefore possible that the pipeline stage 0 (Stage_0) of data transfer is up to the MA circuit and that the stage 1 (Stage_1) is from the MA circuit output units ($104_1$, $104_3$) to FIFO first stage ($106_1$ and $106_4$). In similar manner, the data outputting period on the S-GIO line is from the RCLK0 to RCLK1. It is therefore possible that the stage 1 (Stage_1) may be from the MA circuit output unit ($104_2$, $104_4$) to FIFO first stage ($107_1$, $107_5$).

The structure of the output register is three stages of the latch circuit ($106_1$ to $106_3$; $106_4$ to $106_6$) for the F-GIO line and four stages of the latch circuit ($107_1$ to $107_4$; $107_5$ to $107_8$).

This is the case of the read latency '4'. For the read latency of '5' or '3', the stage 1 (Stage_1) may similarly be from the MA circuit output part to FIFO first stage. Meanwhile, the clock signals CK1, CK25 and CK 35, supplied to the three stage latch circuits $106_1$ to $106_3$ of the output register, correspond to the latency 1, 2.5 and 3.5, such that, if CLK1 is the rise timing of the first clock pulse, CLK25 and CLK35 correspond to the fall timing of the second clock pulse. The selection circuit (multiplexer) 108 selects and outputs an output of the latch circuit $106_3$ with the rise of the clock signal CK4, while selecting and outputting an output of the latch circuit $106_6$ with the fall of the clock signal CK4, selecting and outputting an output of the latch circuit $107_4$ with the rise of the clock signal CK4 of the next cycle and selecting and outputting an output of the latch circuit $107_8$ with the fall of the clock signal CK4 of the next cycle.

In the present embodiment, the number of the GIO lines in the above-described DDR SDRAM, charged/discharged simultaneously, may be decreased from 32 to 16.

Figure 11:
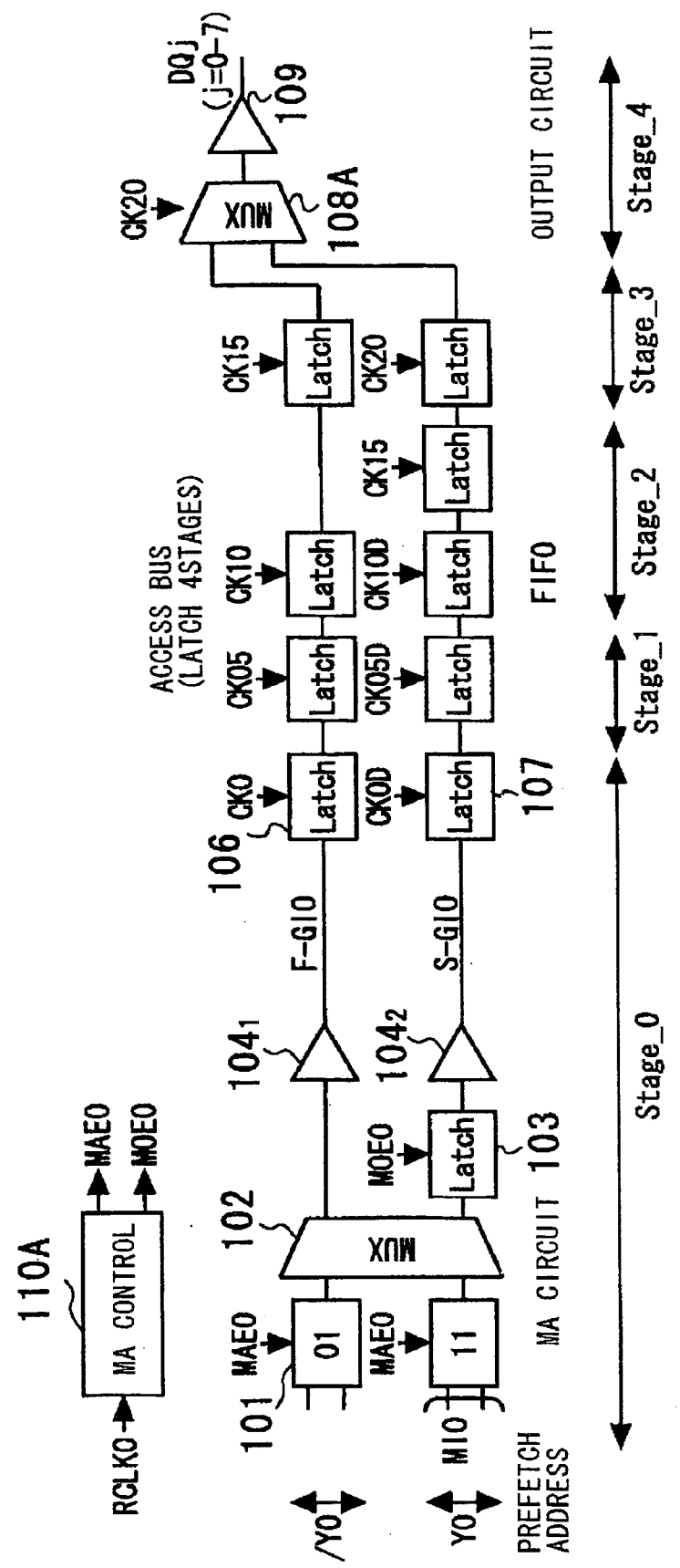
FIG. 11 shows a configuration of a conventional 2N pre-fetch data transfer circuit.
Figure 12:
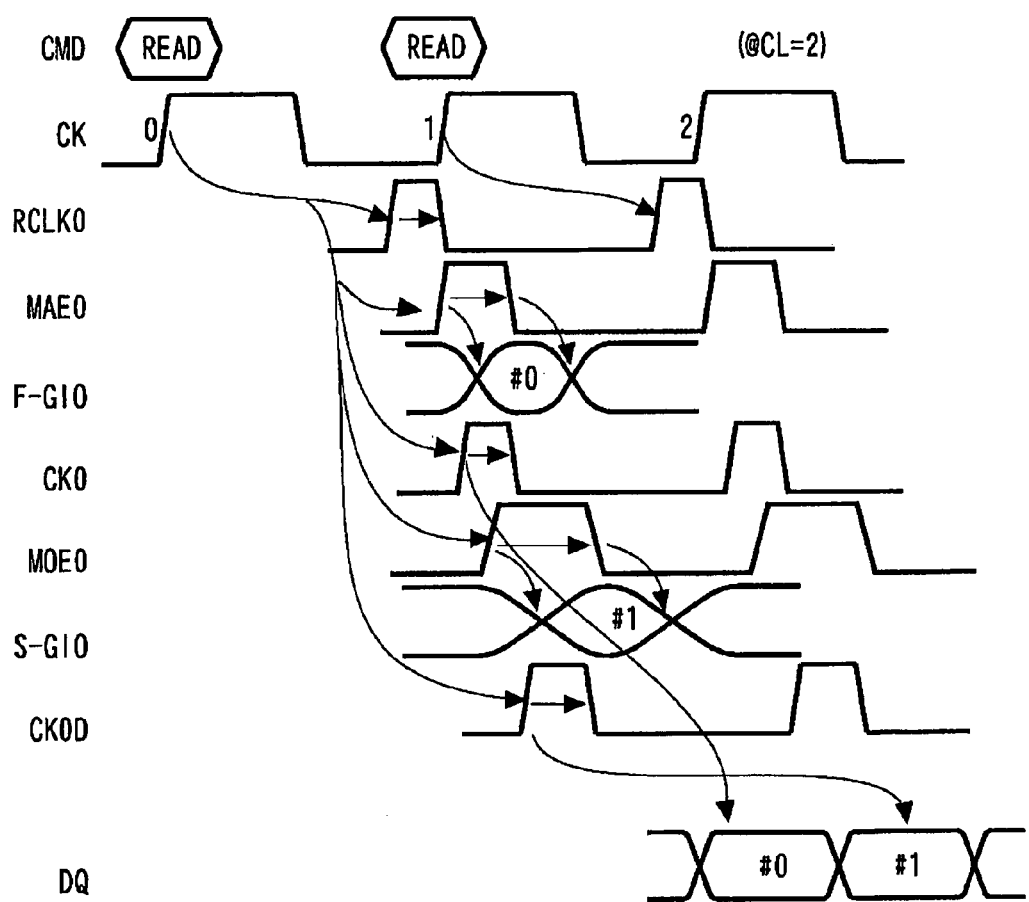
FIG. 12 is a timing chart for illustrating the operation of the conventional 2N pre-fetch data transfer circuit.

Moreover, in the present embodiment, the number of stages of the output registers for the F-GIO line may be reduced from four (see FIG. 11) to three.

Since there is time allowance of one clock cycle time for the latter 16 (2N) bit output data, the data output operation is not deteriorated in performance even though the transfer timing on the S-GIO line is delayed.

Additionally, since only one read command (READ) is input per two clocks, with the 4N pre-fetch, the data read time of the next read command is not affected even though data is held for one clock period on the GIO line.

Figure 4:
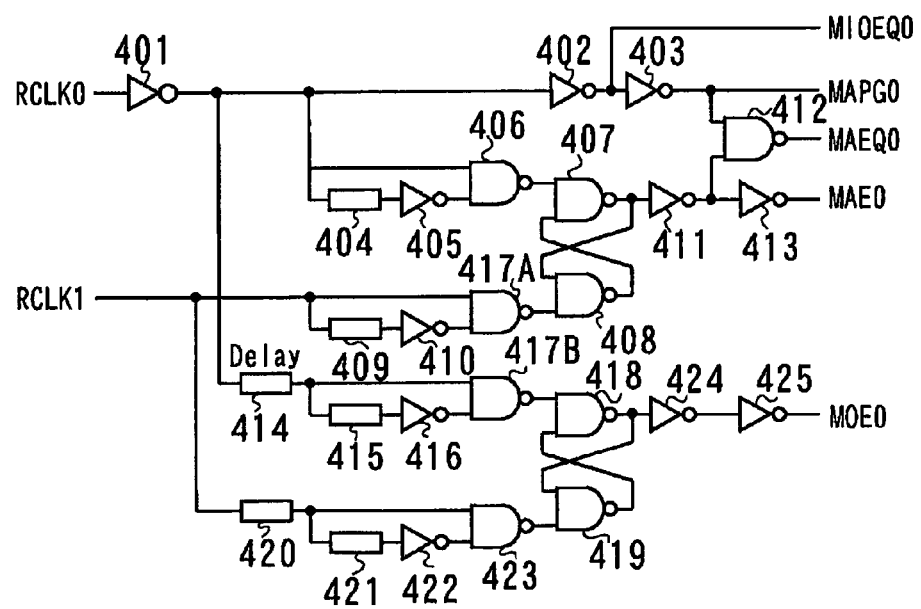
FIG. 4 shows a configuration of an MA control circuit according to the embodiment of the present invention.

FIG. 4 shows a circuit configuration of an embodiment of a main amplifier (MA) control circuit 110 used in the DDR SDRAM according to the present invention. Referring to FIG. 4, showing the main amplifier (MA) control circuit 110, a circuit for generating a one-shot pulse (low level) based on a signal corresponding to the RCKL0 inverted by an inverter 401 (delay circuit 404, inverter 405 and NAND circuit 406) sets an SR flip-flop (407, 408) based on the rise edge of the first read clock signal RCKL0. An output of the SR flip-flop (407, 408) is set to a high level and the output control signal MAE0 rises to a high level via an inverter 411 and an inverter (inverting driver) 413.

A circuit for generating a one-shot pulse from the rise of the second read clock signal RCLK1 (delay circuit 409, inverter 410 and NAND circuit 417A) resets the SR flip-flop (407, 408), based on the rising edge of the second read clock signal RCLK1 to set the output of the SR flip-flop and hence the output control signal MAE0 to a low level. A circuit for generating a one-shot pulse (low level), based on a signal, obtained on inverting the first read clock signal RCKL0 by an inverter 401 and delaying the resulting inverted signal by a delay circuit 414 (delay circuit 415, inverter 416 and NAND circuit 417B) sets an SR flip-flop (418, 419), based on a rising edge of the first read clock signal RCKL0. An output of the SR flip-flop (418, 419) is set to a high level and the output control signal MOE0 rises to a high level via an inverter 424 and an inverter (inverting driver) 425. A signal MIOEQ0, output from the inverter 402, a signal MAPG0, output from the inverter 403 and a signal MAEQ0, output from the NAND circuit 412, are control signals for controlling the operation of the main amplifier (MA) 101, which will be explained subsequently.

Figure 5:
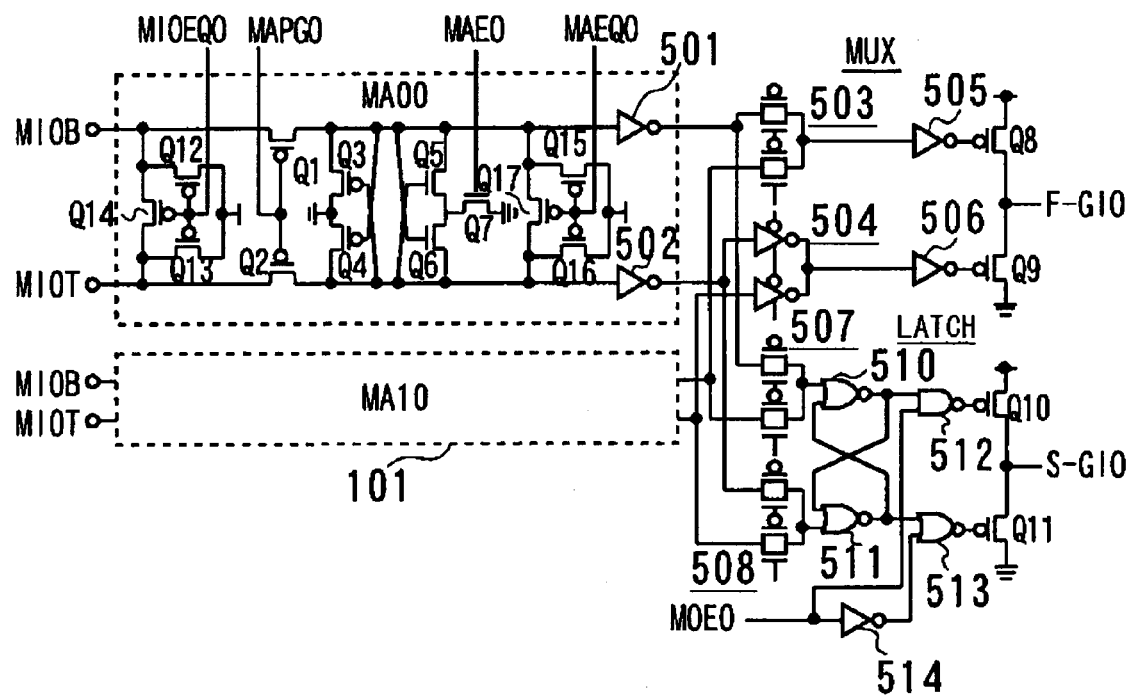
FIG. 5 shows a configuration of an MA circuit according to the embodiment of the present invention.

FIG. 5 shows a configuration of an embodiment of a main amplifier circuit conveniently applied in the present invention. In the present embodiment, there is shown in FIG. 5, by way of an example, an illustrative control circuit for an F-GIO line output control signal MAE0, adapted to cope with 4N pre-fetch, and an output control signal MOE0 for an S-GIO line. The MIO pre-charge control signal MIOEQ0, the MA control signal MAPG0 and the signal MAEQ0 are also generated simultaneously. These control signals are generated by the circuit shown in FIG. 4.

Referring to FIG. 5, signals on a pair of main input/output lines MIOT and MIOB are taken into the main amplifier 101 via p-channel MOSFETs Q1 and Q2 which are turned on when the MA control signal MAPG0 is at a low level. These taken-in signals are amplified by a CMOS latch circuit, composed of p-channel MOSFETs Q3 and Q4, having gates and drains cross-connected, n-channel MOSFETs Q5 and Q6, and an N-channel MOSFET Q7, connected across common connected sources of n-channel MOSFETs Q5 and Q6 and the ground potential of the circuit, and operating as a current source.

That is, if input signals are taken during the low level period of the timing signal MAPG0, and a desired signal level is achieved, the timing signal MAPG0 goes high, such that the main input/output lines MIOT and MIOB are isolated from the input/output terminal of the CMOS latch circuit. The CMOS latch circuit commences the amplifying operation by the high level of the timing signal MAE0. Since the input/output terminal of the CMOS latch circuit is isolated from the MIO line having a large parasitic capacity, the CMOS latch circuit speedily amplifies the signal, transmitted over the MIO line, to the CMOS level, to transmit the so amplified signal to the main amplifier output circuit. Meanwhile, the MOSFETs Q12, Q13 and Q14 represent a circuit for precharging and equalizing the MIO line pair (MIOB, MIOT) based on the signal MIOEQ0. On the other hand, the MOSFETs Q15, Q16 and Q17 precharge and equalize the signal line pair on the main amplifier output circuit side.

An output signal of the main amplifier circuit, that is, an output of the main amplifier MAO0 (corresponding to e.g. $101_1$ of FIG. 1) (outputs of inverters 501, 502), is transmitted to an output circuit composed of a p-channel output MOSFET Q8 and an n-channel output MOSFET Q9 (corresponding to e.g. $104_1$ of FIG. 1) through a CMOS bus gate circuit controlled by Y0 and Y1 addresses (two parallel-connected CMOS transfer gates 503 and two parallel-connected tri-state inverters 504; forming the MUX 102 of FIG. 1), to transmit an output signal taken into the main amplifier circuit to the F-GIO line.

At this time, the output circuit of the F-GIO line (Q8 and Q9) continues to output main amplifier data during the high level period of the output control signal MAE0.

Thus, the output control signal MAE0 goes high during the period as from the rise of the first read clock signal RCKL0, as the fundamental clock, until fall of the second read clock signal RCLK1, and hence the output circuit of the F-GIO line is activated during the one clock period.

On the other hand, the output circuit (Q10 and Q11) on the S-GIO line continues to output main amplifier data during the high level period of the output control signal MOE0. Since the output control signal MOE0 goes high during a period as from the time when the rise of the first read clock signal RCKL0 as the fundamental clock is delayed a preset time by a delay circuit (414 of FIG. 4) until the rise of the second read clock signal RCLK1 is delayed a preset time by a delay circuit (420 of FIG. 4), the output circuit of the S-GIO line (MOSFETs Q10, Q11) is activated for one clock period.

With the above-described structure of the present embodiment, it is possible to hold data on the F-GIO and S-GIO lines during plural clock cycle periods of the synchronizing clock signal CK. If, based on the read start address, the output of the main amplifier MA01 is the first output and that of the main amplifier MA00 is a late output, the output of the main amplifier MA00 is switched to the side of the SR latch circuit (510, 511) by the CMOS path gate circuit, controlled by the Y0 and Y1 addresses (formed by two parallel-connected CMOS transfer gates 507 and two parallel-connected tri-state inverters 508), and is transmitted to an output circuit (Q10 and Q11) of the S-GIO line. On the other hand, an output of the main amplifier MA01 is transmitted via a CMOS path gate circuit (503 and 504) to an output circuit (Q8 and Q9) of the F-GIO line. When the output control signal MOE0 is at a high level, an output of the SR latch circuit (510 and 511) is transmitted via NAND circuit 512 to the gate of the NMOSFET Q10 via NOR circuit. When the second output control signal MOE0 is at a low level, the output circuit (Q10 and Q11) of the S-GIO line is in an off-state (with the output being in high impedance state).

Figure 6:
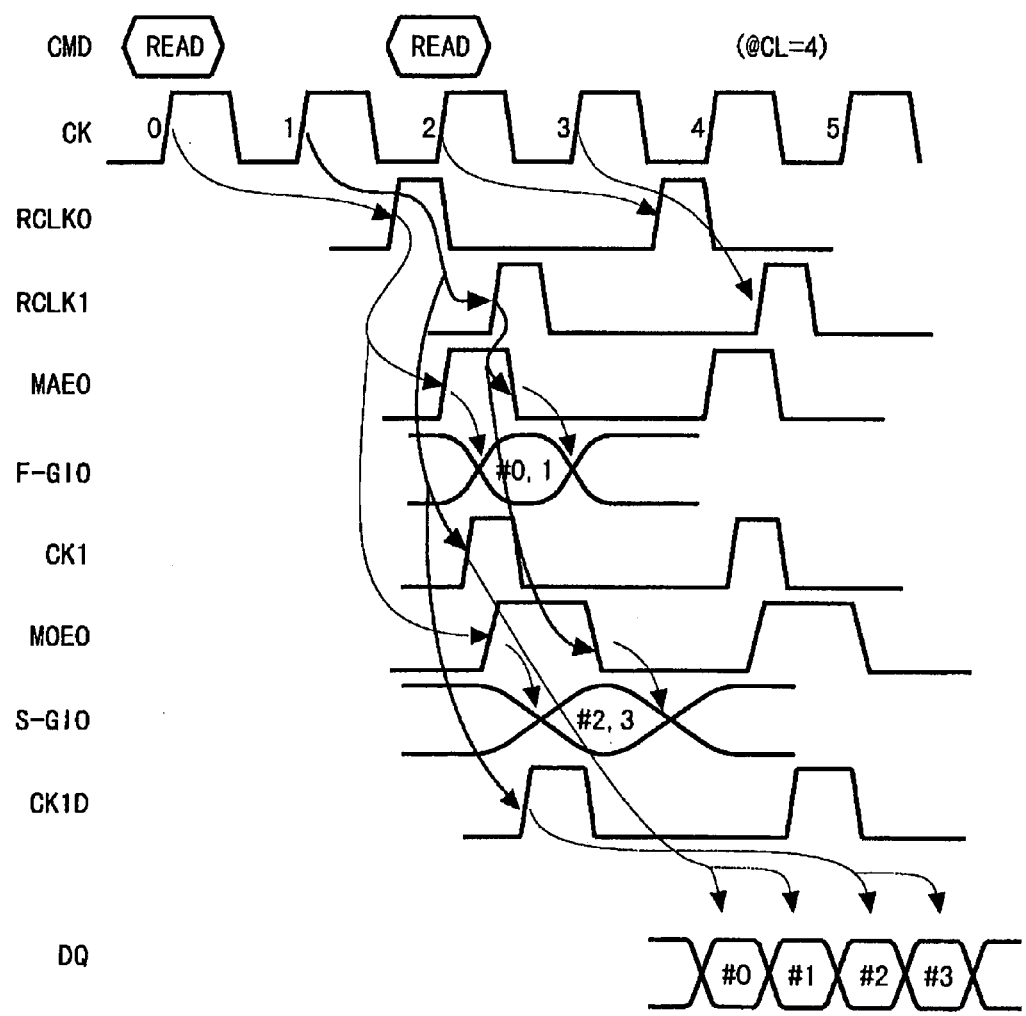
FIG. 6 is a timing chart for illustrating the readout operation of the embodiment of the present invention.

The operation of the present embodiment is now explained by referring to the timing chart of FIG. 6.

The read command (READ) is entered in synchronism with the rising edge of the external clock signal CK. In the 4N pre-fetch memory, the interval between the read command and the next read command is defined by specifications to be not shorter than two clocks. The reason for this is that the inner read operation of the chip is carried out over two clock periods. By employing this technique, with the 4N pre-fetch memory, the operating frequency about twice that of the 2N pre-fetch memory may be achieved.

Hence, if the read command is entered with the rise '0' of the external clock signal, the next read command is entered after the rise '2' of the external clock signal CK.

It is noted that the first read clock signal RCKL0 is generated from the rise '0' and from the rise '2' of the external clock signal CK. On the other hand, the second read clock signal RCLK1 is generated from the rise '1' and from the rise '3' of the external clock signal CK.

In the present embodiment, the output control signals MAE0 and MOE0, supplied to the main amplifier 101, are generated in the control circuit 110, using the first and second read clock signals RCKL0 and RCLK1.

A latch signal CK1 of the initial stage latch circuit ($106_1$, $106_4$) of the output register and a latch signal CK1D of the initial stage latch circuit ($107_1$, $107_5$) of the output register are generated from the rise '1' of the clock signal CK. It is because data can be held for one clock period on the F-GIO line and on the S-GIO line. Meanwhile, the clock period of the latch signals CK1 and CK1D of the output register is set to twice the clock period of the external clock signal CK.

Figure 7:
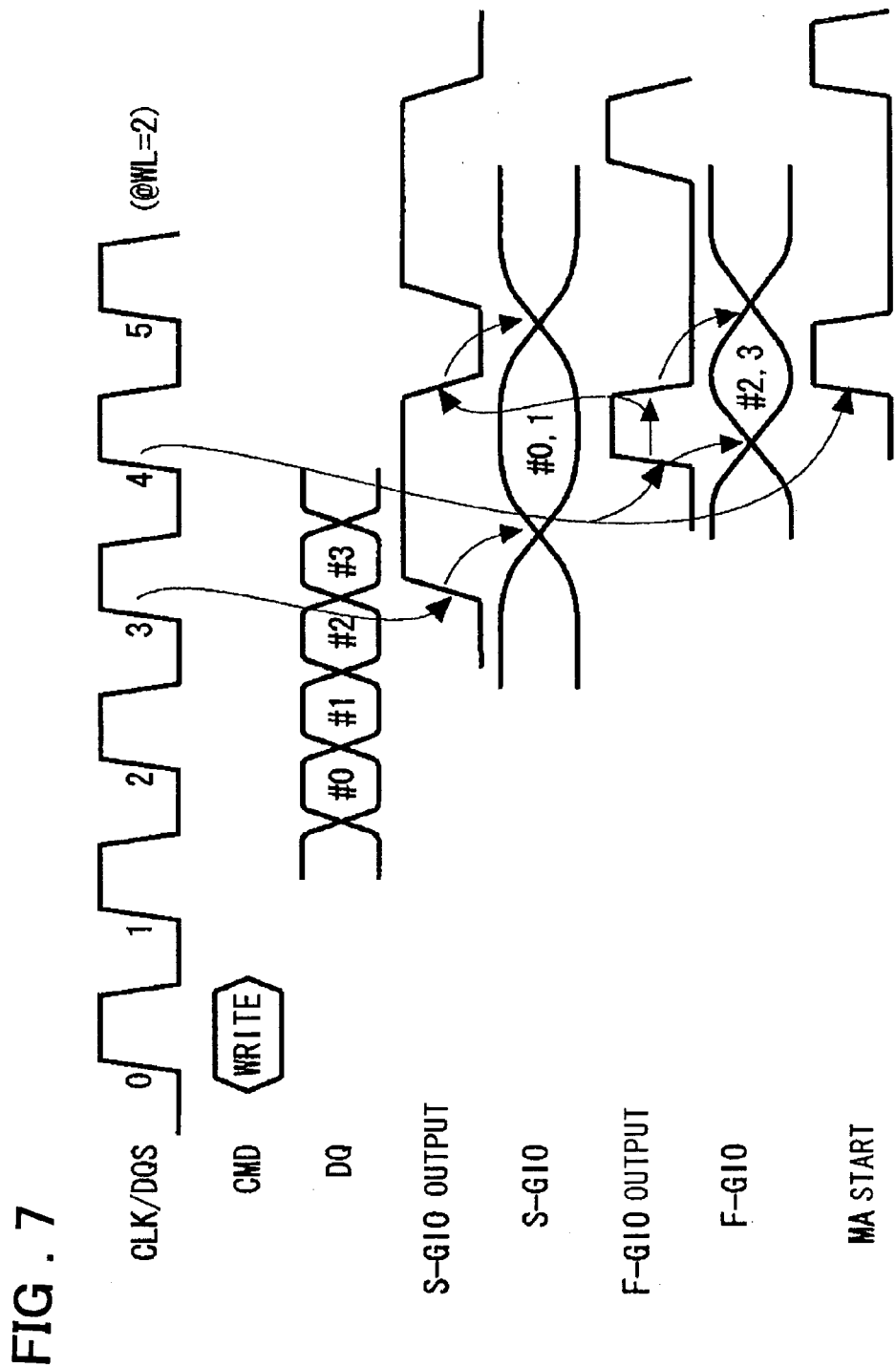
FIG. 7 is a timing chart for illustrating the write operation of the embodiment of the present invention.

The write operation of the present embodiment is carried out in accordance with the timing operation shown in FIG. 7.

That is, for transferring the former half 2-bit data to the DQ pad to the main amplifier MA, the S-GIO line is used and, for transferring the latter half 2-bit data, the F-GIO line is used. At this time, the output control signal of the S-GIO line (S-GIO output of FIG. 7) goes high with the rise '3' of the external clock signal CK, while going low with the rise '4' of the external clock signal CK. The output circuit of the S-GIO line is in operation during the period of the rise '3' to '4' of the external clock signal CK. The output control signal on the F-GIO line (F-GIO output of FIG. 7) goes high with the rise '4' of the external clock signal CK, while going low with a one shot (pulse width of the clock signal CK).

With the present embodiment, configured as described above, data on the S-GIO line may be held for one clock period on the S-GIO line, and hence it is unnecessary to provide the write main amplifier (write amplifier of FIG. 2) with a circuit for latching data on the S-GIO line.

The following meritorious effects may be derived from the above-described embodiments:

(1) By holding data for one clock period during read on the F-GIO line and on the S-GIO line, the pipeline stage 0 of the 4N pre-fetch memory may be up to the main amplifier MA, while the pipeline stage 1 thereof may be from an output part of the main amplifier MA up to the first stage of the FIFO. That is, the number of stages of the latch circuit of the output register may be reduced with advantage to achieve the high speed operation.

(2) In addition to the above, the output circuit may be controlled more readily to save the chip space by reducing the number of stages of the latch circuit of the output register (3) In addition to the above, low current consumption may be achieved by reducing the number of stages of the latch circuit of the output register.

(4) By holding data for one clock period on the S-GIO line during write, the data latch circuit on the S-GIO line of the main amplifier part may be deleted to reduce the chip area as well as to achieve low current consumption.

Figure 8:
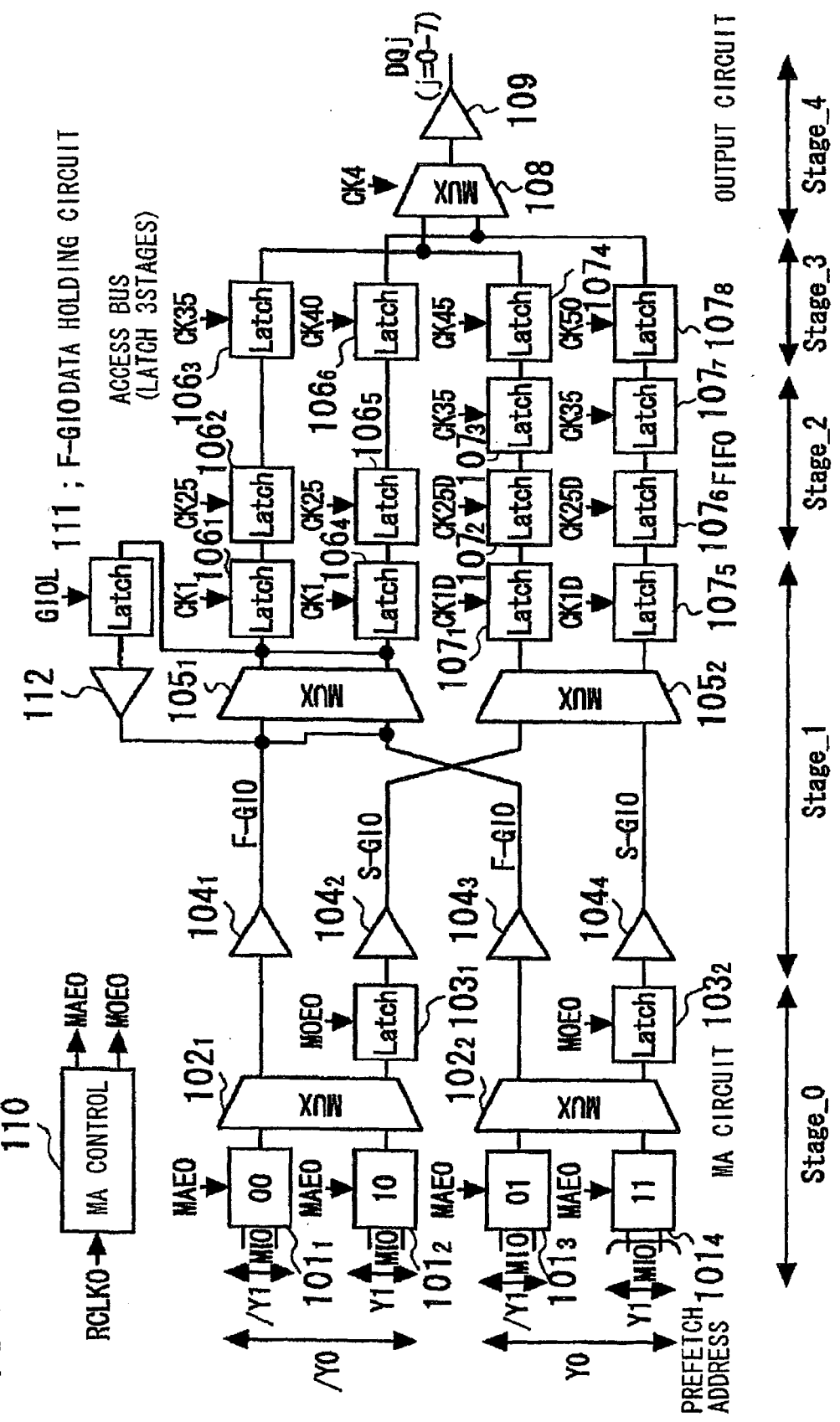
FIG. 8 shows a configuration of a data transfer circuit according to another embodiment of the present invention.

A second embodiment of the present invention is now described. Although the basic structure of the present second embodiment is the same as that of the previous embodiment, further artifices are used in connection with data holding on the GIO line. FIG. 8 shows the configuration of the second embodiment of the present invention. In FIG. 8, the elements which are the same as those of FIG. 1 are depicted by the same reference numerals. Referring to FIG. 8, the second embodiment of the present invention includes a data holding circuit 111 for the GIO line in the output register portion. That is, the present second embodiment includes the data holding circuit 111 for latching an output of the selection circuit $105_1$, and an output of the data holding circuit 111 is connected via output buffer 112 to the F-GIO line. The data holding circuit 111 holds the GIO line data during the high level period of a data holding circuit control signal GIOL.

Figure 9:
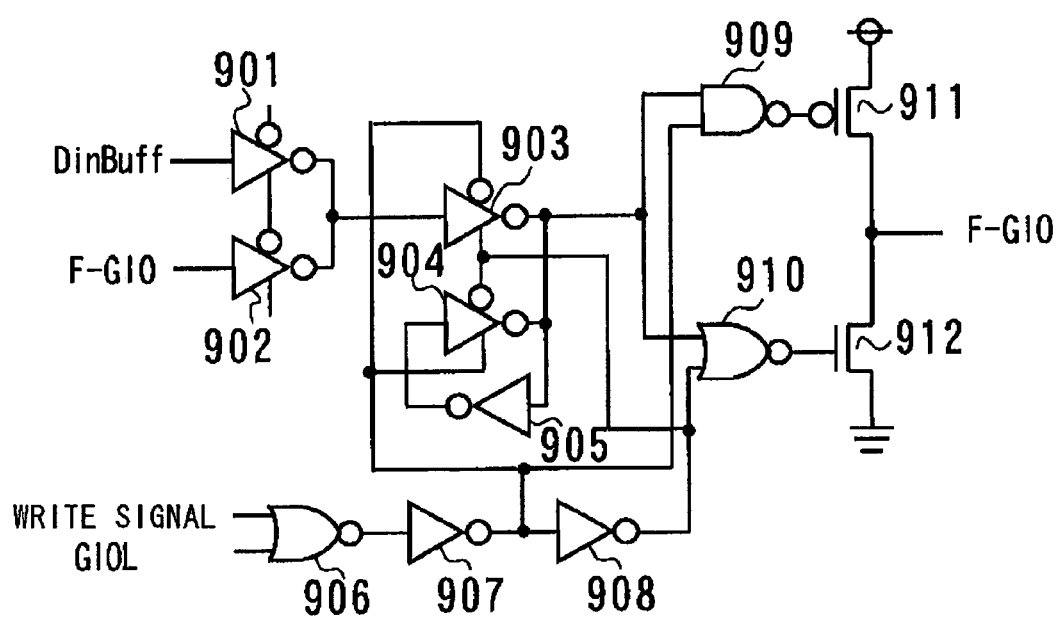
FIG. 9 shows a configuration of a GIO data holding circuit of FIG. 8.

FIG. 9 shows an example of the configuration of a GIO data holding circuit 111 of the present embodiment. Referring to FIG. 1, tri-state buffer circuits 901 and 902, having outputs connected in common, form a selector, supplied with an output of a buffer (corresponding to 221 of FIG. 2) supplied in turn with data at the time of writing (DinBuff) and with an F-GIO, selecting F-GIO at the time of reading, and outputting DinBuff at the time of writing. An output of the selector (901, 902) is supplied to a tristate buffer 903, an output of which is coupled to a flip-flop made up of an inverter 905 and a tristate inverter 904 having inputs and outputs cross-connected to each other. The tri-state inverters 903 and 904 and the inverter 905 form a latch circuit. An output of the latch circuit is supplied to one inputs of a NAND circuit 909 and a NOR circuit 910. Outputs of the NAND circuit 909 and the NOR circuit 910 are supplied to the gates of a PMOSFET 911 and an NMOSFET 912, having sources connected to the power supply VDD and a power supply VSS, and having drains connected in common and connected to the gates of a PMOSFET 911 and an NMOSFET 912. The other input end of the NAND circuit 909 is connected to an output of the inverter 907, supplied with an output of the NOR circuit 906 and outputting an inverted version thereof, while the other input end of the NOR circuit 910 is connected to an output of the inverter 908. The operation of the circuit shown in FIG. 9 is now briefly explained. During the high level period of the data holding circuit control signal GIOL, the output of the NOR circuit 906 is low, while the output of the inverter 907 is high. The NAND circuit 909 transfers an inverted version of the output of the tri-state inverter 903 to the gate of the PMOSFET 911, the output of the inverter 908 is low and the NOR circuit 910 transfers the inverted version of the output of the inverter 903 to the gate of the NMOSFET 912. On the other hand, during the low level period of the data holding circuit control signal GIOL, the output of the NOR circuit 906 is high, the outputs of the inverters 907, 908 are high, the output of the NAND circuit 909 is high, the output of the NOR circuit 910 is low, and the MOSFETs 911 and 912 are both turned off, with the output being in a high impedance state.

In the structure shown in FIG. 9, the F-GIO output circuit for writing is used for holding data during reading of the F-GIO. That is, by employing the data outputting circuit for the F-GIO line during writing as the F-GIO holding circuit during reading, area penalty may be eliminated, while the rate penalty may also be eliminated by preventing the load on the F-GIO line (capacity of the diffusion layer) from increasing.

Meanwhile, it is customary to use the GIO line as a read/write common line for area reduction, such that the data holding circuit may be realized using a limited chip area.

Figure 10:
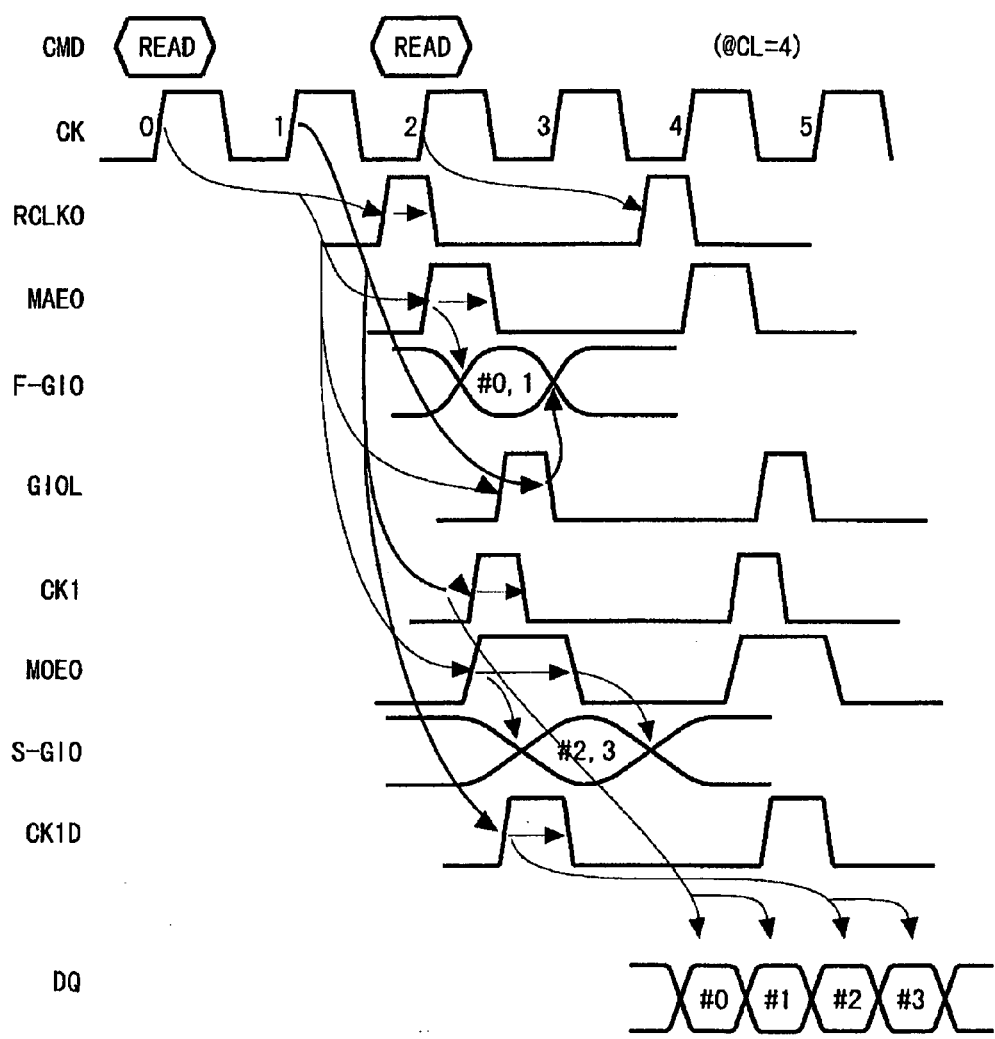
FIG. 10 is a timing chart for illustrating the readout operation of the other embodiment of the present invention.

FIG. 10 shows an example of the timing of the read operation of a second embodiment of the present invention employing the data holding circuit. Referring to FIG. 10, the output control signal MAE0 of F-GIO is generated with one shot from the rise '0' of the external clock signal. Hence, the total outputting period of the F-GIO line of the main amplifier is one-shot, the data holding circuit control signal GIOL of the output register goes high during the period as from the rise '0' until the rise '1' of the external clock signal CK to hold data during one clock period.

Thus, in the present embodiment, it is possible that the pipeline stage 0 (Stage_0) of 4N pre-fetch data transfer is up to the MA circuit and that the pipeline stage 1 (Stage_1) is from the MA output part to the FIFO first stage. It is also possible to reduce the number of latch circuits of the output register to realize the high speed operation.

Moreover, in the present embodiment, the data holding circuit 111 may be co-used with the F-GIO outputting circuit for writing, with the increase in the chip area being substantially zero.

Although the present invention has been explained with reference to preferred embodiments thereof, the present invention is not limited to these embodiments, and may, of course, encompass any variations or corrections that may be arrived at by those skilled in the art within the scope conforming to the principle of the principle of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit device comprising:
a control circuit for generating first and second control signals, different in the timing phase of activation, based on a signal obtained on frequency dividing a clock signal supplied to the semiconductor integrated circuit device from outside the semiconductor integrated circuit device; and
an amplifier circuit stage including four amplifier circuits, and first and second selection circuits, and first and second latch circuits;
said four amplifier circuits being arranged and configured to receive read data signals from a memory cell array corresponding to four addresses, receiving said first control signal in common, and amplifying and outputting data signals corresponding to said four addresses, responsive to said first control signal;
said first selection circuit being arranged and configured to receive data signals of two even addresses of said four addresses, changing over a signal transmitting path of the output destination depending on which of said data signals of two even addresses is output first and on which of said data signals of two even addresses is output later, responsive to a read start address;
said first latch circuit being arranged and configured to receive the one of said data signals of two even addresses, output later, outputting a latch output to a corresponding signal transmitting path responsive to said second control signal;
said second selection circuit being arranged and configured to receive data signals of two odd addresses of said four addresses, changing over a signal transmitting path of the output destination depending on which of said data signals of two odd addresses is output first and on which of said data signals of two odd addresses is output later, responsive to said read start address;
said second latch circuit being arranged and configured to receive the one of said data signals of two odd addresses, output later, outputting a latch output to a corresponding signal transmitting path responsive to said second control signal;
wherein said semiconductor integrated circuit device further comprises:
a third selection circuit arranged and configured to receive the data signal of the even address, output first, and transmitted from said amplifier circuit stage to said signal transmitting path, and the data signal of the odd address, output first, and transmitted from said amplifier circuit stage to said signal transmitting path, to send said data signals to two outputs of a first output register in accordance with a readout sequence;
a fourth selection circuit arranged and configured to receive the data signal of the even address, output later, and transmitted from said amplifier circuit stage to said signal transmitting path, and the data signal of the odd address, output later, and transmitted from said amplifier circuit stage to said signal transmitting path, to send said data signals to two outputs of a second output register in accordance with the readout sequence; and
a fifth selection circuit arranged and configured to receive two outputs of said first output register and two outputs of said second output register, totaling at four outputs, to output the four outputs as serial data output signals in a read address sequence responsive to rising and falling edges of an input synchronizing clock signal.

2. A semiconductor integrated circuit device comprising:
a control circuit receiving read clock signals, obtained on frequency dividing a clock signal supplied from outside the semiconductor integrated circuit device to the semiconductor integrated circuit device, to generate first and second control signals, different in the timing phase of activation;
a signal transmitting path for transmitting first to fourth data signals, read out from a memory cell array, corresponding to four addresses;
first to fourth amplifier circuits, receiving first to fourth data signals, transmitted to said signal transmitting path, receiving said first control signal in common, and amplifying and outputting said first to fourth signals responsive to said first control signal;
a first selection circuit receiving first and second data signals, output from two of the amplifier circuits, associated with two even addresses of said four addresses, to change over the output destination coupling two inputs to one of first and second outputs, responsive to read start addresses;
a second selection circuit receiving third and fourth data signals, output from said two amplifier circuits, associated with two odd addresses of said four addresses, to change over the output destination coupling two inputs to one of first and second outputs, responsive to the read start addresses;

a first latch circuit receiving a data signal from a second output of said first selection circuit to output the latched data signal responsive to said second control signal;

a second latch circuit receiving a data signal from a second output of said second selection circuit to output the latched data signal responsive to said second control signal;

a first amplifier output circuit having an input end connected to a first output end of said first selection circuit;

a second amplifier output circuit having an input end connected to an output end of said first latch circuit;

a third amplifier output circuit having an input end connected to a first output end of said second selection circuit;

a fourth amplifier output circuit having an input end connected to an output end of said second latch circuit;

a third selection circuit receiving the data signals transmitted from said first and third amplifier output circuits to two signal transmitting paths to change over the output destination of the input data signals to first and second output ends in a readout sequence;

a fourth selection circuit receiving to data signals transmitted from said second and fourth amplifier output circuits to two signal transmitting paths to change over the output destination of the input data signals to first and second output ends in a readout sequence;

two series of first first-in and first-out registers, receiving data signals output from first and second output ends of said third selection circuit in parallel to output the signals in parallel;

two series of second first-in and first-out registers, receiving data signals output from first and second output ends of said four selection circuit in parallel to output the signals in parallel; and a fifth selection circuit for receiving the two series of parallel outputs of said first first-in and first-out registers and the two series of parallel outputs of said second first-in and first-out registers, totaling at four outputs, to output said four outputs as serial data output signals in a read address sequence, based on input clock signals, responsive to the rising edge and falling edge of two cycles of clock pulses.

3. The semiconductor integrated circuit device according to claim 2, wherein said control circuit includes a circuit supplied responsive to a read command with first and second read clock signals obtained on frequency dividing by two said clock signal supplied to the semiconductor integrated circuit device, said first and second read clock signals exhibiting phase difference equal to one clock cycle of said clock signal, said circuit determining the activation period of said first control signal based on transition edges of said first and second read clock signals, said circuit also determining the activation period of said second control signal based on the transition edges of signals obtained on delaying said first and second read clock signals respectively.

4. The semiconductor integrated circuit device according to claim 1, further comprising;

a data holding circuit receiving and holding a data signal from at least one output end of said third selection circuit, and having art output connected to a signal transmitting path connected in turn to an input end of said third selection circuit, said data holding circuit being also used as a data outputting circuit configured for outputting a data signal to said signal transmitting path.

5. The semiconductor integrated circuit device according to claim 2, further comprising;

a data holding circuit receiving and holding a data signal from at least one output end of said third selection circuit, and having an autput connected to a signal transmitting path connected in turn to an input end of said third selection circuit, said data holding circuit being also used as a data outputting circuit configured for outputting a data signal to said signal transmitting path.

6. A semiconductor integrated circuit device comprising:

a first group of signal transmitting paths for transmitting plural data signals of even addresses in parallel;

a first group of amplifier circuit units for receiving said plural data signals of even addresses;

a second group of signal transmitting paths for transmitting plural data signals of odd addresses in parallel;

a second group of amplifier circuit units for receiving said plural data signals of odd addresses;

a third group of signal transmitting paths for transmitting the data signals of said even addresses amplified by said first group of amplifier circuit units;

a fourth group of signal transmitting paths for transmitting the data signals of said odd addresses amplified by said second group of amplifier circuit units;

each of said first and second groups of amplifier circuit units including a latch circuit for latching at least one data signal to be output later than another data signal to be output first, and for outputting the so latched data signal, so that at least one data signal to be output later is output with a delay to a corresponding signal transmitting path;

a circuit unit for interchanging plural data signals, to be output first, out of said plural data signals to be propagated on said first and third groups of said signal transmitting paths in parallel, in readout sequence, to output the so interchanged data signals to a corresponding output register of a first group of output registers;

a circuit unit for interchanging plural data signals, to be output later, out of said plural data signals to be propagated on said second and fourth groups of said signal transmitting paths in parallel, in readout sequence, to output the so interchanged data signals to a corresponding output register of a second group of the output registers; and an output circuit for receiving data signals output from said first and second groups of the output registers to output the data signals serially in accordance with address signals.

7. The semiconductor integrated circuit device according to claim 6, further comprising:

a control circuit receiving first and second readout clock signals, different in phase, obtained on frequency dividing by two of a clock signal supplied from outside the semiconductor integrated circuit device to said semiconductor integrated circuit device, to generate first and second control signals;

wherein said first group of signal transmitting paths have first and second signal transmitting paths for transmitting first and second data signals of even addresses in parallel;

wherein said second group of signal transmitting paths have third and fourth signal transmitting paths for transmitting third and fourth data signals of odd addresses in parallel;

wherein said first group of amplifier circuit units include:

first and second main amplifiers receiving said first and second data signals to amplify the first and second data signals based on said first control signal respectively;

a first selection circuit receiving outputs of said first and second main amplifiers for interchanging the connection across two inputs and first and second output ends based on a read start address;

a first latch circuit for receiving data signals from the second output end of said first selection circuit to output the latched data signal responsive to the read start address; and first and second main amplifier output circuits receiving and driving-outputting a first output of said first selection circuit and an output of said first latch circuit;

wherein said second group of the amplifier circuit units include:

third and fourth main amplifiers receiving said third and fourth data signals to amplify the data signals based on said first control signal;

a second selection circuit receiving said third and fourth data signals to interchange connection of two inputs to first and second outputs based on the read start address;

a second latch circuit for receiving data signals from a second output of said second selection circuit to output the latched data signal responsive to said second control signal; and third and fourth main amplifier output circuits, receiving and driving-outputting a first output of said second selection circuit and an output of said second latch circuit;

wherein said third group of signal transmitting paths include fifth and sixth signal transmitting paths for transmitting output signals from said first and second main amplifier output circuits;

wherein said fourth group of signal transmitting paths include seventh and eighth signal transmitting paths for transmitting output signals from said third and fourth main amplifier output circuits;

wherein said semiconductor integrated circuit device further comprises:

a third selection circuit receiving data signals transmitted on said fifth and sixth signal transmitting paths for interchanging the connection across two inputs and first and second outputs in accordance with a readout sequence; and a fourth selection circuit receiving data signals transmitted on said seventh and eighth signal transmitting paths for interchanging the connection across two inputs and first and second outputs in accordance with the readout sequence;

the two outputs of said third selection circuit being supplied to first and second first-in first-out registers, respectively;

the two outputs of said fourth selection circuit being supplied to third and fourth first-in first-out registers, respectively; and wherein said output circuit includes a fifth selection circuit for serially outputting outputs of said first to fourth first-in first-out registers, based on an input clock signal, responsive to rising and falling edges of two cycles of clack pulses; and an output buffer for outputting data signals at an output data terminal, responsive to an output signal from said fifth selection circuit.

8. The semiconductor integrated circuit device according to claim 6, further comprising:

a plurality of memory cell arrays on a semiconductor chip, each made up by a plurality of bit lines extending along a first direction and a plurality of word Lines extending along a second direction perpendicular to said first direction, with a plurality of memory cells arranged at the points of intersection of said bit lines and the word lines;

wherein an X-decoder is provided on one side of said memory array for extending along said first direction; and a Y-decoder and said main amplifier are arranged on a side of said memory array perpendicular to said one side;

said Y-decoders and said main amplifiers of two of said memory arrays, facing each other, being symmetrically arranged in a side-by-side relation to each other with a peripheral circuit as center; and wherein said third and fourth groups of signal transmitting paths, forming global input/output lines, are arranged in said peripheral circuit, and connected to said first and second groups of the signal transmitting paths associated with a selected memory bank; said global input/output lines being connected through an input register and said output register to an output data terminal via an output buffer and an input buffer.

9. The semiconductor integrated circuit device according to claim 7, buffer comprising:

a plurality of memory cell arrays on a semiconductor chip, each made up by a plurality of bit lines extending along a first direction and a plurality of word lines extending along a second direction perpendicular to said first direction, with a plurality of memory cells arranged at the points of intersection of said bit lines and the ward lines;

wherein an X-decoder is provided on one side of said memory array for extending along said first direction; and a Y-decoder and said main amplifier are arranged on a side of said memory array perpendicular to said one side;

said Y-decoders and said main amplifiers of two of said memory arrays, facing each other, being symmetrically arranged in a side-by-side relation to each other with a peripheral circuit as center; and wherein said third and fourth groups of signal transmitting paths, fanning global input/output lines, are arranged in said peripheral circuit, and connected to said first and second groups of the signal transmitting paths associated wit the selected memory bank; said global input/output lines being connected through an input register and said output register to an output data terminal via an output buffer and art input buffer.

10. The semiconductor integrated circuit device according to claim 8, wherein said first and second groups of signal transmitting pats form a common input/output line for write data transmitted from a write circuit in parallel; and wherein at least one clock cycle of the transmitted write data signals is held by holding circuitry on said global input/output line.

11. The semiconductor integrated circuit device according to claim 9, wherein said first and second groups of signal transmitting pats form a common input/output line for write data transmitted from a write circuit in parallel; and wherein at least one clock cycle of the transmitted write data signals is held by holding circuitry on said global input/output line.

* * * * *